(12) United States Patent
Niimi et al.

(10) Patent No.: US 7,960,802 B2
(45) Date of Patent: Jun. 14, 2011

(54) METHODS TO ENHANCE EFFECTIVE WORK FUNCTION OF MID-GAP METAL BY INCORPORATING OXYGEN AND HYDROGEN AT A LOW THERMAL BUDGET

(75) Inventors: Hiroaki Niimi, Dallas, TX (US); James Joseph Chambers, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 20 days.

(21) Appl. No.: 12/621,618

(22) Filed: Nov. 19, 2009

(65) Prior Publication Data

US 2010/0127335 A1    May 27, 2010

Related U.S. Application Data

(60) Provisional application No. 61/116,892, filed on Nov. 21, 2008.

(51) Int. Cl.
*H01L 29/76* (2006.01)
(52) U.S. Cl. ........ 257/407; 257/204; 257/351; 257/371; 257/E27.062
(58) Field of Classification Search .................. 257/204, 257/351, 371, 407
See application file for complete search history.

(56) References Cited

U.S. PATENT DOCUMENTS

| 7,612,422 B2 * | 11/2009 | Chambers et al. ............ 257/407 |
| 2004/0106261 A1 * | 6/2004 | Huotari et al. ................ 438/287 |
| 2005/0104112 A1 * | 5/2005 | Haukka et al. ................ 257/310 |

OTHER PUBLICATIONS

U.S. Appl. No. 12/275,812, filed Nov. 21, 2008 by Chambers et al.
Chambers et al., Metal Gate Electrode Impurity Engineering for Control of Effective Work Function, Presentation, Aug. 24, 2009, Dallas, USA.

* cited by examiner

*Primary Examiner* — Wai-Sing Louie
(74) *Attorney, Agent, or Firm* — Jacqueline J. Garner; Wade J. Brady, III; Frederick J. Telecky, Jr.

(57) ABSTRACT

A process is disclosed of forming metal replacement gates for PMOS transistors with oxygen in the metal gates such that the PMOS gates have effective work functions above 4.85. Metal work function layers in the PMOS gates are oxidized at low temperature to increase their effective work functions to the desired PMOS range. Hydrogen may also be incorporated at an interface between the metal gates and underlying gate dielectrics. Materials for the metal work function layers and processes for the low temperature oxidation are disclosed.

10 Claims, 8 Drawing Sheets

METHODS TO ENHANCE EFFECTIVE WORK FUNCTION OF MID-GAP METAL BY INCORPORATING OXYGEN AND HYDROGEN AT A LOW THERMAL BUDGET

FIELD OF THE INVENTION

This invention relates to the field of integrated circuits. More particularly, this invention relates to metal gates of MOS transistors in integrated circuits.

BACKGROUND OF THE INVENTION

P-channel metal oxide semiconductor (PMOS) transistors in advanced integrated circuits frequently have replacement metal gates to improve on-state current densities. Attaining desired effective work functions of the metal gates in PMOS transistors without significantly increasing fabrication cost and complexity has been problematic.

SUMMARY OF THE INVENTION

The instant invention provides a process for forming an integrated circuit which includes PMOS transistors with metal replacement gates. The process forms gate work function metal layers in the PMOS transistors with effective work functions less than 4.8 eV. The work function metal layers are oxidized at low temperature to increase their effective work functions toward the desired PMOS range above 4.82 eV. Various low temperature oxidation processes suitable for this step are disclosed. Hydrogen atoms may also diffuse to an interface between the work function metal layers and underlying gate dielectric layers.

A first embodiment of the low temperature oxidation process includes thermal oxidation in a steam ambient. A second embodiment of the low temperature oxidation process includes exposure to a plasma containing oxygen and hydrogen. A third embodiment of the low temperature oxidation process includes exposure to an oxygen plasma and exposure to a hydrogen plasma. A fourth embodiment of the low temperature oxidation process includes exposure to an electrolyte solution containing ionized oxygen radicals and hydrogen ions.

In one embodiment, oxygen atoms in the work function metal layers may have a distribution of at least $1 \times 10^{15}$ atoms/$cm^2$ within 1 nanometer of the top surfaces of the gate dielectric layers. In another embodiment, the oxygen atoms in the work function metal layer may have an average concentration between $1 \times 10^{18}$ atoms/$cm^3$ and $1 \times 10^{21}$ atoms/$cm^3$. The hydrogen atoms in the work function metal layers may have a distribution of at least $1 \times 10^{15}$ atoms/$cm^2$ within 1 nanometer of the top surfaces of the gate dielectric layer.

DETAILED DESCRIPTION

Figure 1A:
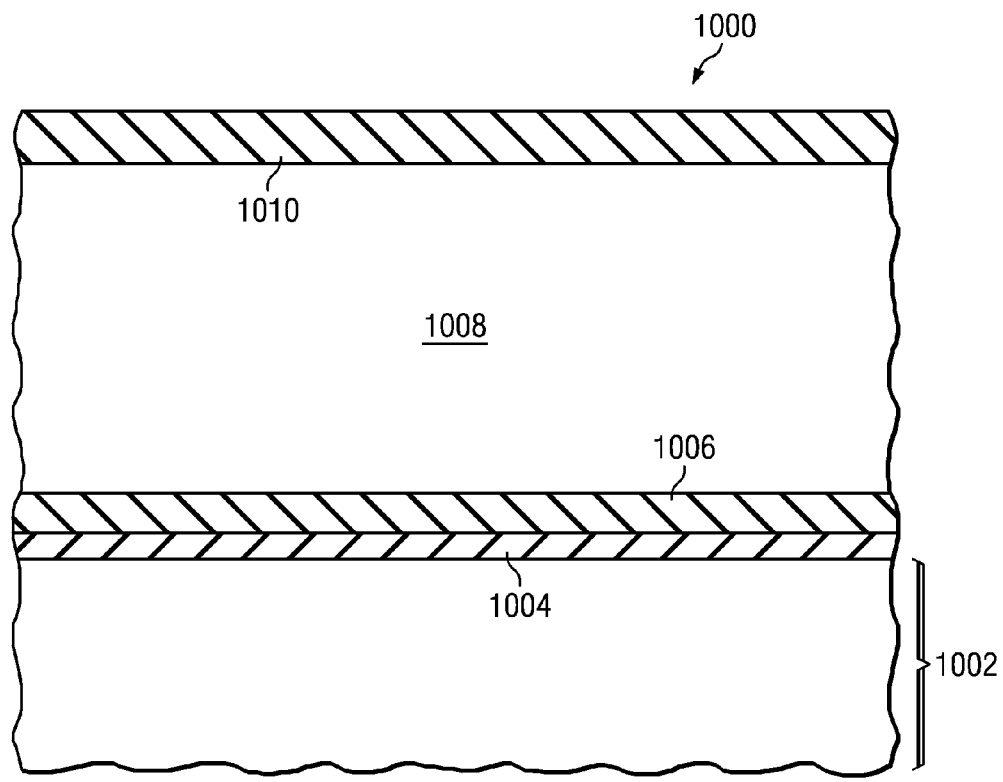
FIG. 1A through FIG. 1F are cross-sections of an integrated circuit containing a PMOS transistor formed according to the instant invention, depicted in successive stages of fabrication.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this disclosure, the term "eV" is understood to mean the unit of energy known as electron-volt. One eV is substantially equal to $1.602 \times 10^{-19}$ joules. The term "meV" is understood to mean milli-electron volts. One meV is substantially equal to $1.602 \times 10^{-22}$ joules.

For the purposes of this disclosure, the term "millitorr" is understood to mean the unit of pressure equal to 0.001 ton.

For the purposes of this disclosure, the term "MOS transistor" will be understood to mean metal oxide semiconductor transistor.

For the purposes of this disclosure, the term "work function" will be understood to mean a potential energy difference, measured in eV, between an electron at the Fermi level in a material, to which the work function is being referenced, and an electron in a vacuum adjacent to the material. For example, intrinsic silicon has a work function of approximately 4.6 eV at 25 C. N-type silicon with a doping density between $3 \times 10^{17}$ $cm^{-3}$ and $3 \times 10^{18}$ $cm^{-3}$ has a work function of approximately 4.1 eV at 25 C. P-type silicon with a doping density between $3 \times 10^{17}$ $cm^{-3}$ and $3 \times 10^{18}$ $cm^{-3}$ has a work function of approximately 5.1 eV at 25 C. The term "effective work function" will be understood to mean a calculated potential energy of an electron in a gate in an MOS transistor which is consistent with an observed flat-band potential and all substrate and gate interface charge effects.

Chemical formulas such as SiON of a material in this disclosure are understood to list elements of which the material is substantially composed, but no stoichiometric relationships between the elements are implied or may be assumed, unless numerical subscripts are included in the chemical formulas. Descriptions of gases or reagents which include hydrogen atoms are understood to possibly have deuterium atoms substituted for a portion or all of the hydrogen atoms. Descriptions of hydrogen atom distributions are understood to possibly include deuterium atoms.

The instant invention provides a process for forming an integrated circuit which includes PMOS transistors with metal replacement gates. An initial effective work function of the metal gates in the PMOS transistors is less than 4.8 eV. A subsequent low temperature oxidation process adds oxygen atoms to the work function metal layers which raises the effective work function to a desired range above 4.85 eV. Hydrogen may also be added to the metal gates during the low temperature oxidation process to further increase the effective work function and possibly passivate an interface between the metal gates and an underlying gate dielectric layer. Metal fill gate material may be formed over the work function metal layers to reduce electrical resistance of the PMOS gates.

FIG. 1A through FIG. 1F are cross-sections of an integrated circuit containing a PMOS transistor formed according to the instant invention, depicted in successive stages of fabrication. Referring to FIG. 1A, the integrated circuit 1000 is formed on a semiconductor substrate 1002 which is commonly a single crystal silicon wafer, but may be a silicon-on-insulator (SOI) wafer, a hybrid orientation technology (HOT) wafer with regions of different crystal orientations, or other material appropriate for fabrication of the integrated circuit 1000. A PMOS gate dielectric layer 1004 is formed on a top surface of the substrate 1002. The PMOS gate dielectric layer 1004 is typically one or more layers of silicon dioxide ($SiO_2$), silicon oxy-nitride (SiON), aluminum oxide ($Al_2O_3$), aluminum oxy-nitride (AlON), hafnium oxide (HfO), hafnium silicate (HfSiO), hafnium silicon oxy-nitride (HfSiON), zirconium oxide (ZrO), zirconium silicate (ZrSiO), zirconium silicon oxy-nitride (ZrSiON), a combination of the aforementioned materials, or other insulating material. The PMOS gate dielectric layer 1004 may include nitrogen as a result of exposure to a nitrogen containing plasma or a nitrogen containing ambient gas at temperatures between 50 C and 800 C. The PMOS gate dielectric layer 1004 is typically between 1 and 4 nanometers thick. A thicker PMOS gate dielectric layer 1004 may be formed in PMOS transistors operating above 2.5 volts. The PMOS gate dielectric layer 1004 may be formed by any of a variety of gate dielectric formation processes, for example thermal oxidation, plasma nitridation of an oxide layer, and/or dielectric material deposition by atomic layer deposition (ALD).

A PMOS gate work function metal layer 1006 is formed on a top surface of the PMOS gate dielectric layer 1004. The PMOS gate work function metal layer 1006 may be titanium nitride (TiN), tantalum nitride (TaN), tantalum carbide (TaC), or other metal with an effective work function between 4.5 and 4.7 eV. The PMOS gate work function metal layer 1006 may be between 1 and 10 nanometers thick, and may be formed by physical vapor deposition (PVD), chemical vapor deposition (CVD), metal-organic chemical vapor deposition (MOCVD), ALD, or other process appropriate for deposition of thin metal films.

A dummy gate layer 1008 is formed on a top surface of the PMOS gate work function metal layer 1006. The dummy gate layer 1008 may be polycrystalline silicon, commonly known as polysilicon, or other material such as silicon germanium which has a high etch selectivity to the PMOS gate work function metal layer 1006 during a subsequent dummy gate removal process. In an alternate embodiment, the dummy gate layer 1008 may be doped with phosphorus to improve etch selectivity to the PMOS gate work function metal layer 1006 during the subsequent dummy gate removal process. In one embodiment, the dummy gate layer 1008 is between 40 and 80 nanometers thick. In another embodiment, the thickness of the dummy gate layer 1008 is between two and three times a width of a PMOS gate to be formed in the integrated circuit 1000. The dummy gate layer 1008 may be formed by plasma enhanced chemical vapor deposition (PECVD) or other deposition process appropriate for forming thin films of dummy gate material.

An optional hard mask 1010 is formed on a top surface of the dummy gate layer 1008. The hard mask 1010 may include one or more layers of silicon nitride (SiN), silicon oxy-nitride (SiON), silicon carbide (SiC), silicon oxy-carbide (SiOC), silicon oxy-nitride-carbide (SiCON), or other dielectric material appropriate for blocking silicidation of the top surface of the dummy gate layer 1008 during a subsequent silicidation process, and appropriate for providing a stop layer for a subsequent chemical mechanical polish (CMP) process. The hard mask 1010 may be formed by PVD, CVD, PECVD, MOCVD or other deposition process. In one embodiment, the hard mask 1010 may be between 20 and 40 nanometers thick.

Figure 1B:
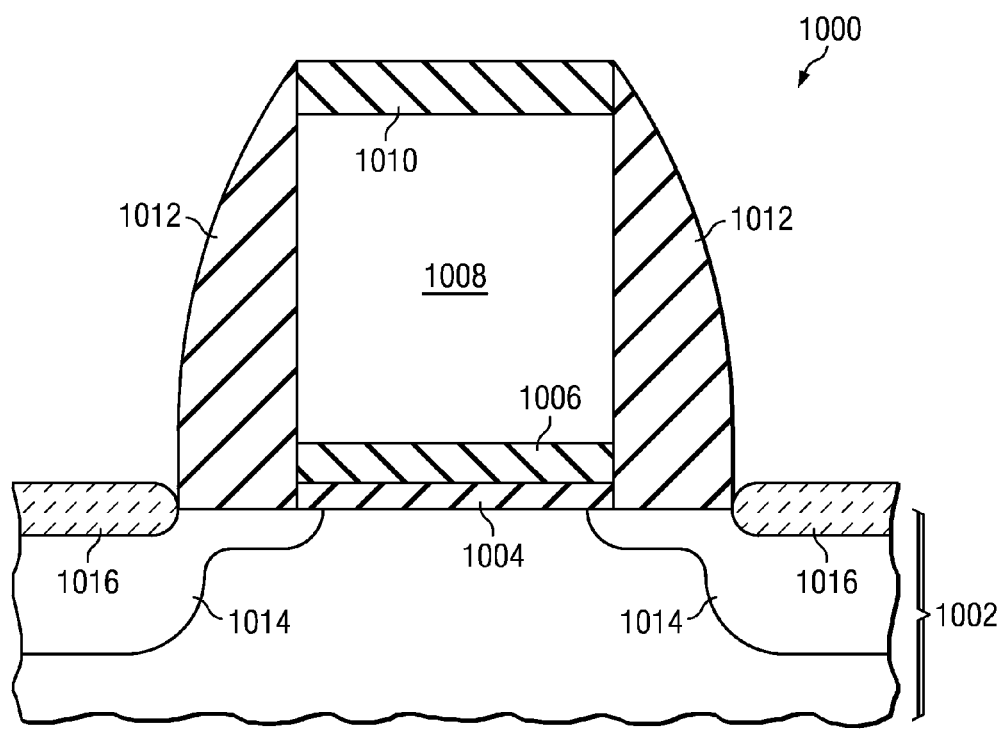

Referring to FIG. 1B, unwanted material from the hard mask 1010 if present, the dummy gate layer 1008, the PMOS gate work function metal layer 1006 and the PMOS gate dielectric layer 1004 is removed during a gate etch process. A gate photoresist pattern, not shown in FIG. 1B for clarity, is formed on an existing top surface of the integrated circuit 1000. The gate etch process includes reactive ion etch (RIE) process steps which provide fluorine containing etchants and possibly chlorine containing etchants from a plasma to a top surface of the integrated circuit 1000. The photoresist pattern blocks the etchants from an area defined for a PMOS gate.

PMOS gate sidewall spacers 1012 are formed on lateral surfaces of the dummy gate layer 1008, the PMOS gate work function metal layer 1006 and the PMOS gate dielectric layer 1004, typically by deposition of one or more conformal layers of silicon nitride and/or silicon oxide on a top and lateral surfaces of the PMOS gate layers and the top surface of the substrate 1002, followed by removal of the conformal layer material from a region above the dummy gate layer 1008 and from the top surface of the substrate 1002 by anisotropic etching methods, leaving the conformal layer material on the lateral surfaces of the dummy gate layer 1008, the PMOS gate work function metal layer 1006 and the PMOS gate dielectric layer 1004. The PMOS gate sidewall spacers 1012 are typically 10 to 50 nanometers thick.

P-type source and drain (PSD) regions 1014, including p-type lightly doped drain (PLDD) regions, are formed in the substrate 1002 adjacent to the PMOS gate dielectric layer 1004 by ion implanting p-type dopants such as boron and possibly gallium or indium into the substrate 1002. PLDD regions are formed by implanting p-type dopants adjacent to the PMOS gate dielectric layer 1004 prior to formation of the PMOS gate sidewall spacers 1012. Additional p-type dopants are implanted after formation of the PMOS gate sidewall spacers 1012 and annealed to form the PSD regions 1014.

PSD metal silicide layers 1016 are formed on top surfaces of the PSD regions 1014. The metal silicide layers 1016 are formed on exposed silicon areas of the top surface of the PSD regions 1014, commonly by depositing a layer of metal, such as nickel, cobalt, or titanium, on a top surface of the integrated circuit 1000, heating the integrated circuit 1000 to react a portion of the metal with exposed silicon in active areas of the integrated circuit 1000, and selectively removing unreacted metal from the integrated circuit 1000 surface, commonly by exposing the integrated circuit 1000 to wet etchants including a mixture of an acid and hydrogen peroxide. The hard mask 1010, if present, desirably blocks formation of metal silicide on the top surface of the dummy gate layer 1008. Silicide formation on the top surface of the dummy gate layer 1008 may be blocked by other means. It is desirable to block formation of metal silicide on the top surfaces of the dummy gate layer 1008 so as to improve etch characteristics of the dummy gate layer 1008 during the subsequent dummy gate removal process.

Figure 1C:
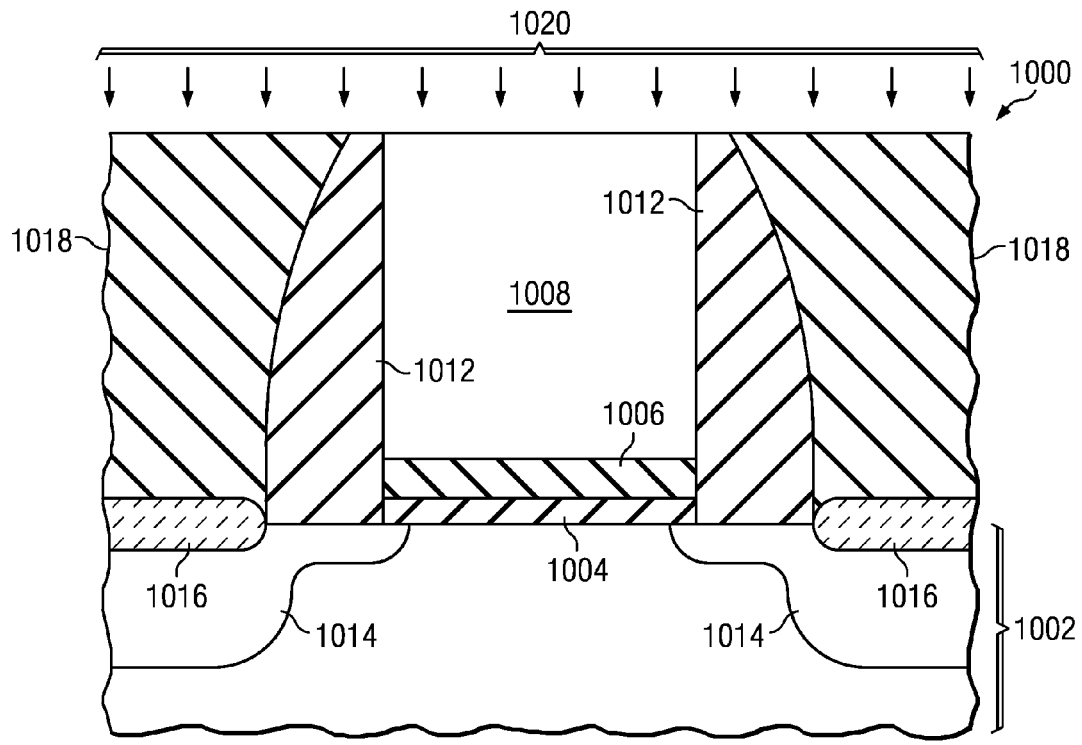

Referring to FIG. 1C, a conformal fill oxide layer 1018 is formed on an existing top surface of the integrated circuit 1000. In one embodiment, the fill oxide layer 1018 is composed substantially of silicon dioxide, formed by thermal decomposition of tetraethyl orthosilicate, also known as tetraethoxysilane or TEOS, by thermal curing of methylsilsesquioxane (MSQ), by a high density plasma (HDP) process, by an ozone based thermal chemical vapor deposition (CVD) process, also known as a high aspect ratio process (HARP), by a low pressure chemical vapor deposition (LPCVD) process or by an atmospheric pressure chemical vapor deposition (APCVD) process. The fill oxide layer 1018 is removed from a region above the dummy gate layer 1008 by a selective removal process such as an oxide CMP process. The hard mask 1010 if present desirably provides a stop layer for the CMP process. An etchback process 1020 removes the hard mask 1010 if present, and removes material from top surfaces of the PMOS gate sidewall spacers 1012 and the fill oxide layer 1018. In one embodiment, the etchback process 1020 provides substantially equal etch rates of the hard mask 1010, the PMOS gate sidewall spacers 1012 and the fill oxide layer 1018. The etchback process 1020 may include an RIE step using fluorine containing etchants and possibly oxygen ions.

Figure 1D:
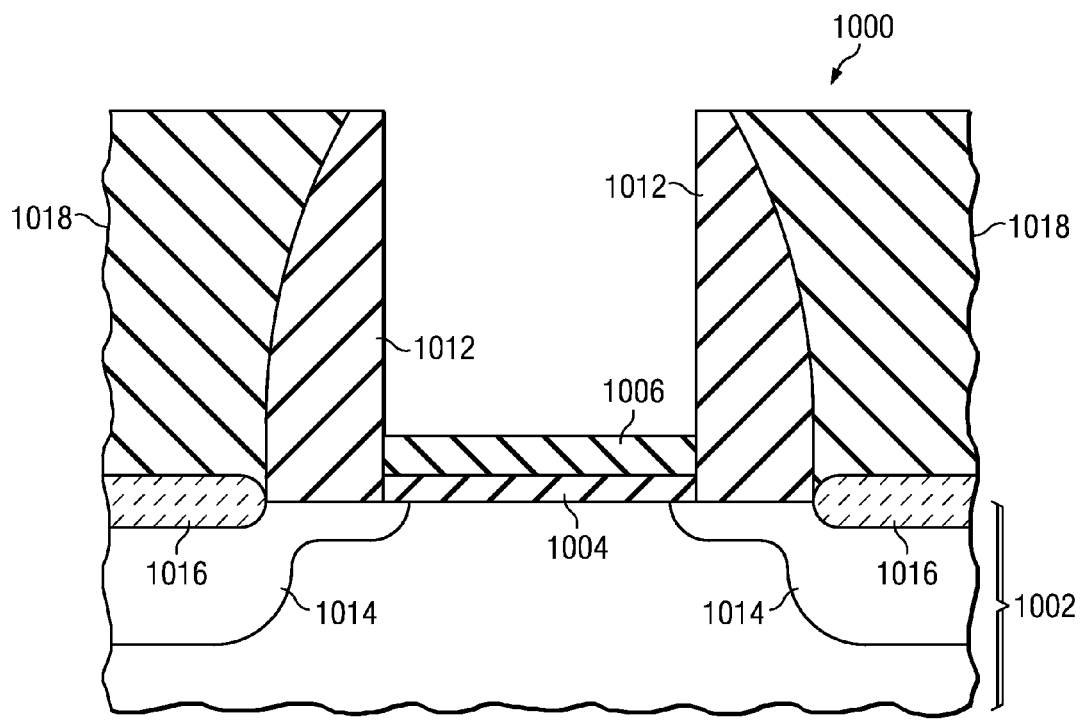

FIG. 1D depicts the integrated circuit 1000 after a dummy gate removal process. In one embodiment of the dummy gate removal process, the integrated circuit 1000 is exposed to wet etchants which include aqueous ammonium hydroxide ($NH_4OH$) at a concentration between 0.5 and 5 percent, at a temperature between 25 C and 50 C, for 20 to 150 seconds. In another embodiment of the dummy gate removal process, the integrated circuit 1000 is exposed to wet etchants which include an aqueous mixture of $NH_4OH$ and tetra-methyl ammonium hydroxide (TMAH). In a further embodiment, the integrated circuit 1000 is exposed to wet etchants which include choline. The dummy gate layer material is removed from the region defined for the PMOS gate while providing an etch selectivity to the PMOS gate work function metal layer 1006 of more than 100:1.

Figure 1E:
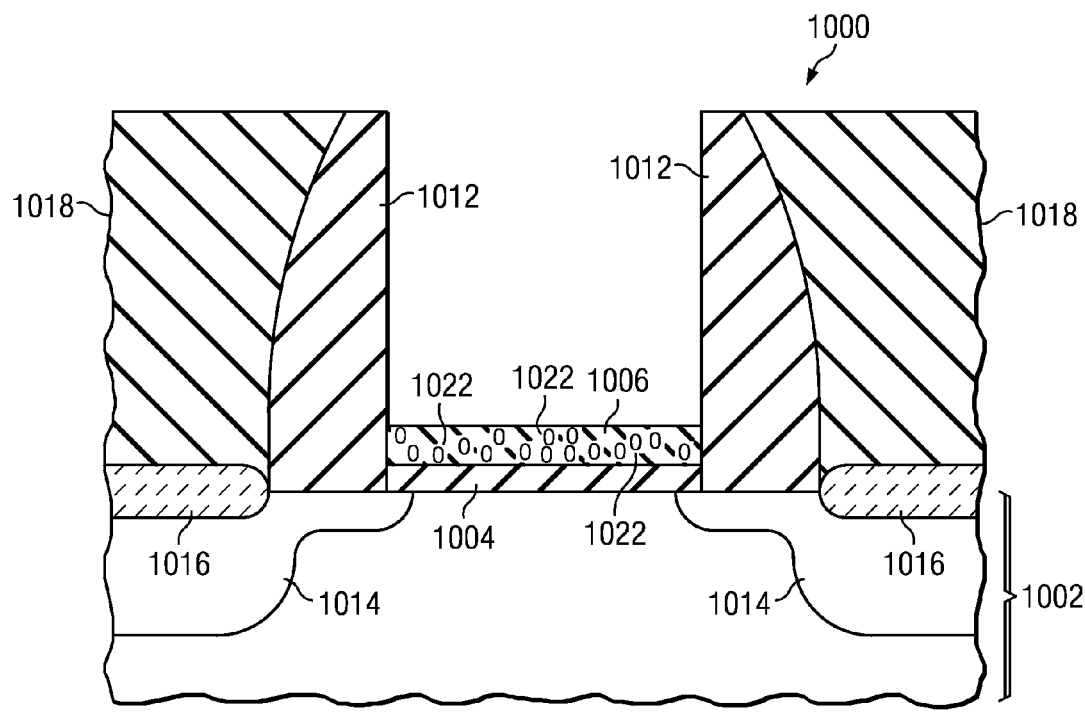

FIG. 1E depicts the integrated circuit 1000 after a low temperature oxidation process. Oxygen atoms 1022 are provided by the low temperature oxidation process to an existing top surface of the integrated circuit 1000, and diffuse in to the PMOS gate work function metal layer 1006. In one embodiment, the oxygen atoms 1022 in the PMOS gate work function metal layers 1006 may have a distribution of at least $1 \times 10^{15}$ atoms/cm$^2$ within 1 nanometer of the top surfaces of the PMOS gate dielectric layer 1004. In another embodiment, the oxygen atoms 1022 in the PMOS gate work function metal layers 1006 may have an average concentration between $1 \times 10^{18}$ atoms/cm$^3$ and $1 \times 10^{21}$ atoms/cm$^3$. The oxygen atoms 1022 in the PMOS gate work function metal layers 1006 increase the effective work function of the PMOS gate work function metal layers 1006 to above 4.85 eV.

Figure 1F:
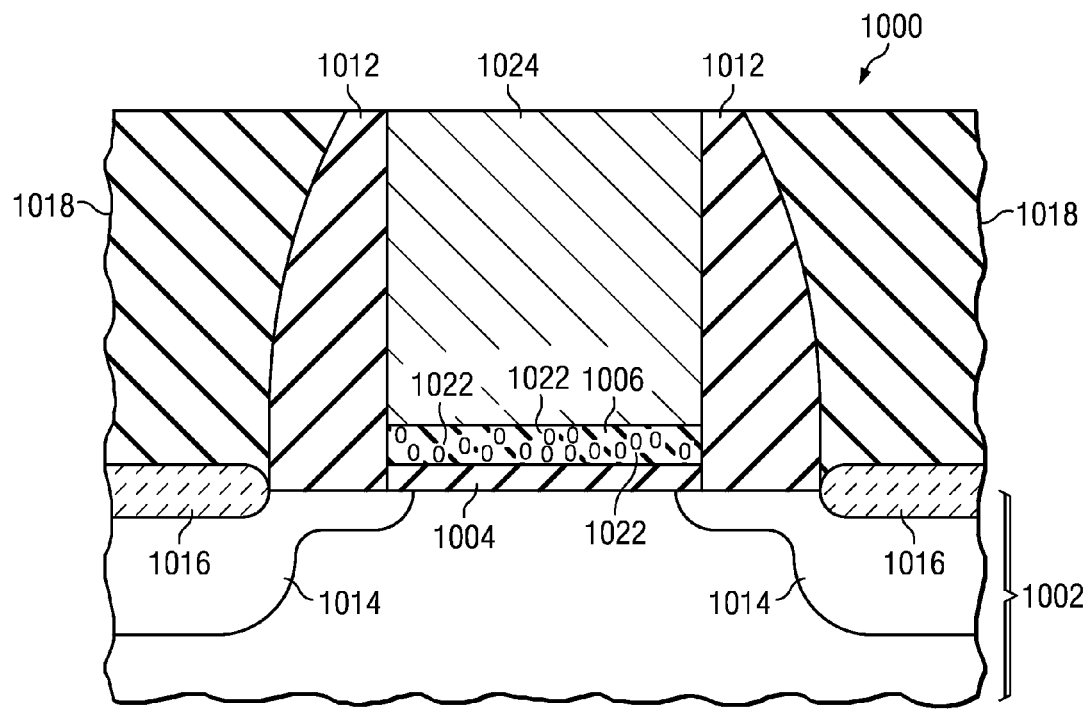

FIG. 1F depicts the integrated circuit 1000 after formation of a metal fill gate layer 1024 over the PMOS gate work function metal layer 1006. The metal fill gate layer 1024 may be aluminum, tungsten, or any metal with a suitably low electrical resistivity. The metal fill gate layer 1024 may be formed by ALD, CVD, PVD, MOCVD or other suitable deposition method. In one embodiment, the metal fill gate layer 1024 may be formed on an existing top surface of the integrated circuit 1000 and selectively removed from areas outside the PMOS gate. The selective removal process may be a CMP process, an isotropic chemical or physical etch process, or a combinations thereof. Formation of the integrated circuit 1000 is continued using known processes.

Figure 2:
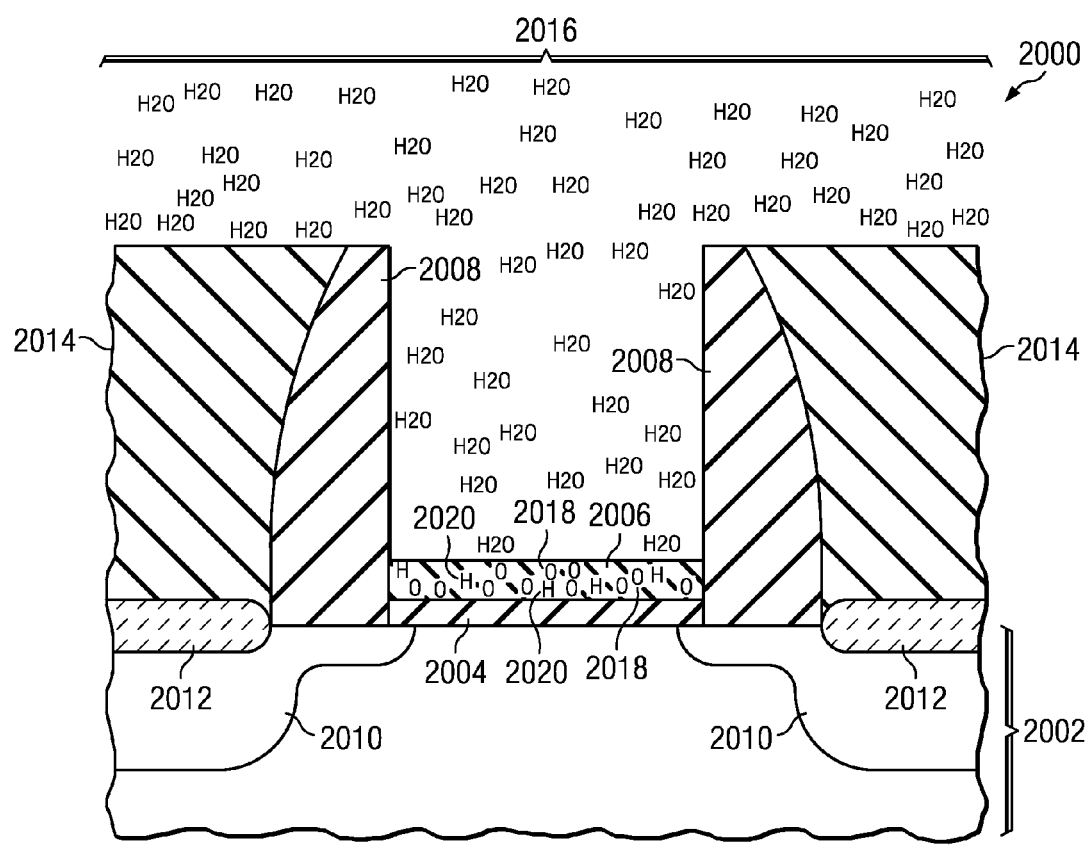
FIG. 2 is a cross-section of an integrated circuit containing a PMOS transistor formed according to the instant invention, depicted during a first embodiment of a low temperature oxidation process to diffuse oxygen atoms into a PMOS gate work function metal layer.

FIG. 2 is a cross-section of an integrated circuit containing a PMOS transistor formed according to the instant invention, depicted during a first embodiment of a low temperature oxidation process to diffuse oxygen atoms into a PMOS gate work function metal layer. The integrated circuit 2000 is formed on a substrate 2002 as described in reference to FIG. 1A. A PMOS gate structure including a PMOS gate dielectric layer 2004, a PMOS gate work function metal layer 2006 and PMOS gate sidewall spacers 2008 is formed on a top surface of the substrate 2002 as described in reference to FIG. 1A through FIG. 1D. PSD regions 2010 are formed in the substrate 2002 adjacent to the PMOS gate dielectric layer 2004, and PSD silicide layers 2012 are formed on a top surface of the PSD regions 2010, as described in reference to FIG. 1B. An oxide fill layer 2014 is formed on a top surface of the integrated circuit 2000 in contact with the PMOS gate sidewall spacers 2008, as described in reference to FIG. 1C. A dummy gate layer is formed over the PMOS gate work function metal layer 2006 and subsequently removed, as described in reference to FIG. 1A through FIG. 1D.

The first embodiment of the low temperature oxidation process includes a thermal oxidation step in a steam ambient. In one version of the first embodiment, the integrated circuit 2000 is exposed to water vapor 2016 at a pressure up to one atmosphere, at a temperature between 300 C and 600 C. In an alternate version of the first embodiment, an ambient steam pressure may be between one atmosphere and seven atmospheres. An ambient of the thermal oxidation step may include oxygen gas up to 50 percent of the water vapor pressure. The ambient may include inert gases, such as nitrogen or argon, up to 50 percent of the water vapor pressure. During the thermal oxidation step, oxygen atoms 2018 diffuse into the PMOS gate work function metal layer 2006. Hydrogen atoms 2020 may also diffuse into the PMOS gate work function metal layer 2006.

In one version of the first embodiment, the oxygen atoms 2018 in the PMOS gate work function metal layer 2006 may have a distribution of at least $1 \times 10^{15}$ atoms/cm$^2$ within 1 nanometer of the top surfaces of the PMOS gate dielectric layer 2004. In another embodiment, the oxygen atoms 2018 in the PMOS gate work function metal layer 2006 may have an average concentration between $1 \times 10^{18}$ atoms/cm$^3$ and $1 \times 10^{21}$ atoms/cm$^3$. The oxygen atoms 2018 desirably increase the effective work function of the PMOS gate work function metal layer 2006 to above 4.85 eV. The integrated circuit 2000 may be exposed to the steam ambient in the thermal oxidation step between 10 seconds and 30 minutes, depending on an oxygen diffusion rate into the PMOS gate work function metal layer 2006.

Hydrogen atoms 2020 desirably reduce interface states at a boundary between the PMOS gate work function metal layer 2006 and the PMOS gate dielectric layer 2004. It will be recognized by those familiar with MOS transistor design and fabrication that benefits of incorporation of hydrogen into the PMOS gate work function metal layer 2006 may be increased by substituting deuterium for hydrogen. Accordingly, in some versions of the first embodiment, the steam ambient of the thermal oxidation step may include water molecules containing deuterium at a ratio to hydrogen above one percent. In some versions of the first embodiment, the hydrogen atoms 2020 in the PMOS gate work function metal layer 2006 may have a distribution of at least $1\times10^{15}$ atoms/cm$^2$ within 1 nanometer of the top surfaces of the PMOS gate dielectric layer 2004.

Figure 3:
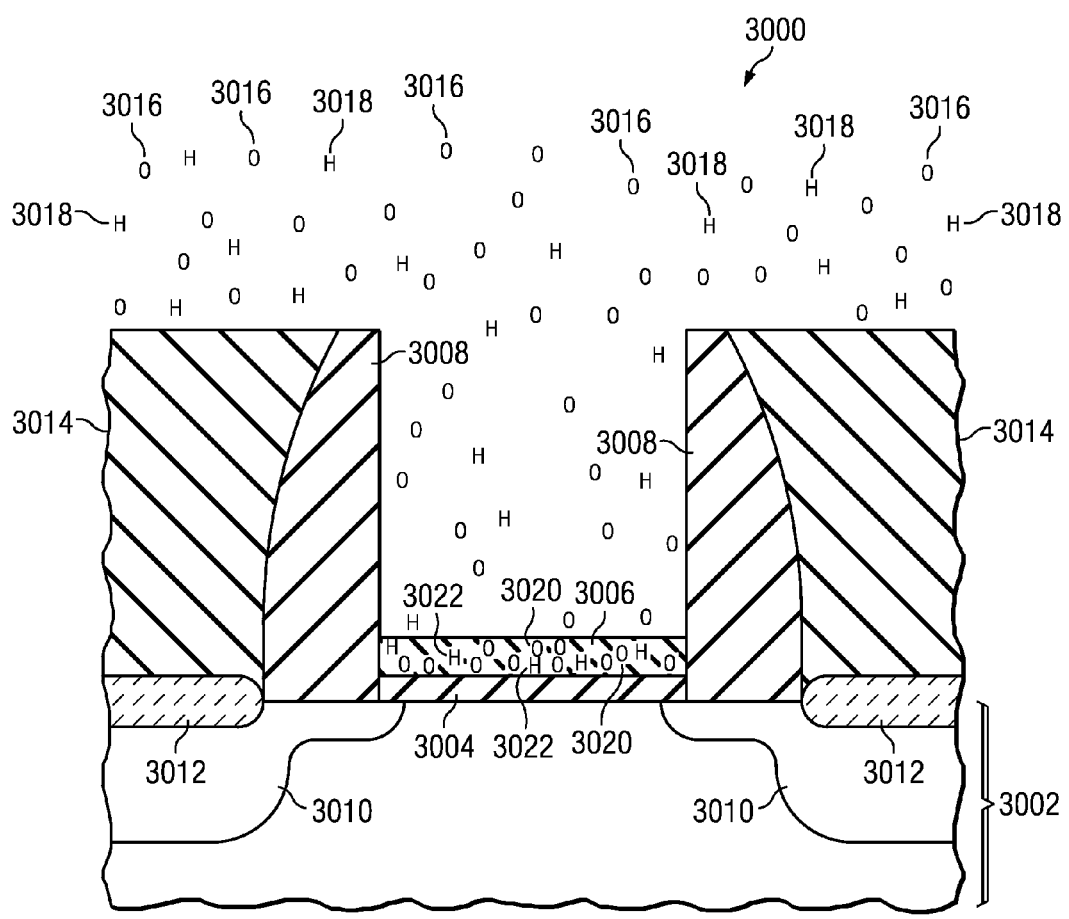
FIG. 3 is a cross-section of an integrated circuit containing a PMOS transistor formed according to the instant invention, depicted during a second embodiment of a low temperature oxidation process to diffuse oxygen atoms into a PMOS gate work function metal layer.

FIG. 3 is a cross-section of an integrated circuit containing a PMOS transistor formed according to the instant invention, depicted during a second embodiment of a low temperature oxidation process to diffuse oxygen atoms into a PMOS gate work function metal layer. The integrated circuit 3000 is formed on a substrate 3002 as described in reference to FIG. 1A. A PMOS gate structure including a PMOS gate dielectric layer 3004, a PMOS gate work function metal layer 3006 and PMOS gate sidewall spacers 3008 is formed on a top surface of the substrate 3002 as described in reference to FIG. 1A through FIG. 1D. PSD regions 3010 are formed in the substrate 3002 adjacent to the PMOS gate dielectric layer 3004, and PSD silicide layers 3012 are formed on a top surface of the PSD regions 3010, as described in reference to FIG. 1B. An oxide fill layer 3014 is formed on a top surface of the integrated circuit 3000 in contact with the PMOS gate sidewall spacers 3008, as described in reference to FIG. 1C. A dummy gate layer is formed over the PMOS gate work function metal layer 3006 and subsequently removed, as described in reference to FIG. 1A through FIG. 1D.

The second embodiment of the low temperature oxidation process includes exposure to a plasma containing oxygen and hydrogen. In one version of the second embodiment, the plasma is formed in a gas mixture at a pressure between 0.1 and 5 torr. A flow rate of oxygen gas into the plasma may be between 1 and 250 sccm in a plasma chamber which can accommodate a 300 mm wafer. A flow rate of hydrogen gas into the plasma may be between 1 and 20 sccm in the 300 mm wafer plasma chamber. The plasma may also contain an inert gas such as argon. In another version of the second embodiment, a flow rate of argon into the plasma may be between 100 and 1000 sccm in the 300 mm wafer plasma chamber. Microwave power provided to the plasma may be between 1500 and 5000 watts in the 300 mm wafer plasma chamber. A temperature of the integrated circuit 3000 during exposure to the plasma may be between 25 C and 500 C. The plasma provides oxygen radicals and/or ions 3016 and hydrogen ions 3018 to a top surface of the PMOS gate work function metal layer 3006.

During exposure to the plasma, oxygen atoms 3020 from the plasma diffuse into the PMOS gate work function metal layer 3006. Hydrogen atoms 3022 may also diffuse into the PMOS gate work function metal layer 3006. In one version of the second embodiment, the oxygen atoms 3020 in the PMOS gate work function metal layer 3006 may have a distribution of at least $1\times10^{15}$ atoms/cm$^2$ within 1 nanometer of the top surfaces of the PMOS gate dielectric layer 3004. In another embodiment, the oxygen atoms 3020 in the PMOS gate work function metal layer 3006 may have an average concentration between $1\times10^{18}$ atoms/cm$^3$ and $1\times10^{21}$ atoms/cm$^3$. The oxygen atoms 3020 desirably increase the effective work function of the PMOS gate work function metal layer 3006 to above 4.85 eV. The integrated circuit 3000 may be exposed to the plasma between 5 and 20 seconds, depending on an oxygen diffusion rate into the PMOS gate work function metal layer 3006.

In some versions of the second embodiment, the hydrogen atoms 3022 in the PMOS gate work function metal layer 3006 may have a distribution of at least $1\times10^{15}$ atoms/cm$^2$ within 1 nanometer of the top surfaces of the PMOS gate dielectric layer 3004. Hydrogen atoms 3022 desirably reduce interface states at a boundary between the PMOS gate work function metal layer 3006 and the PMOS gate dielectric layer 3004. It will be recognized by those familiar with MOS transistor design and fabrication that benefits of incorporation of hydrogen into the PMOS gate work function metal layer 3006 may be increased by substituting deuterium for hydrogen. Accordingly, in some versions of the second embodiment, the plasma may include deuterium at a ratio to hydrogen above one percent.

Figure 4A:
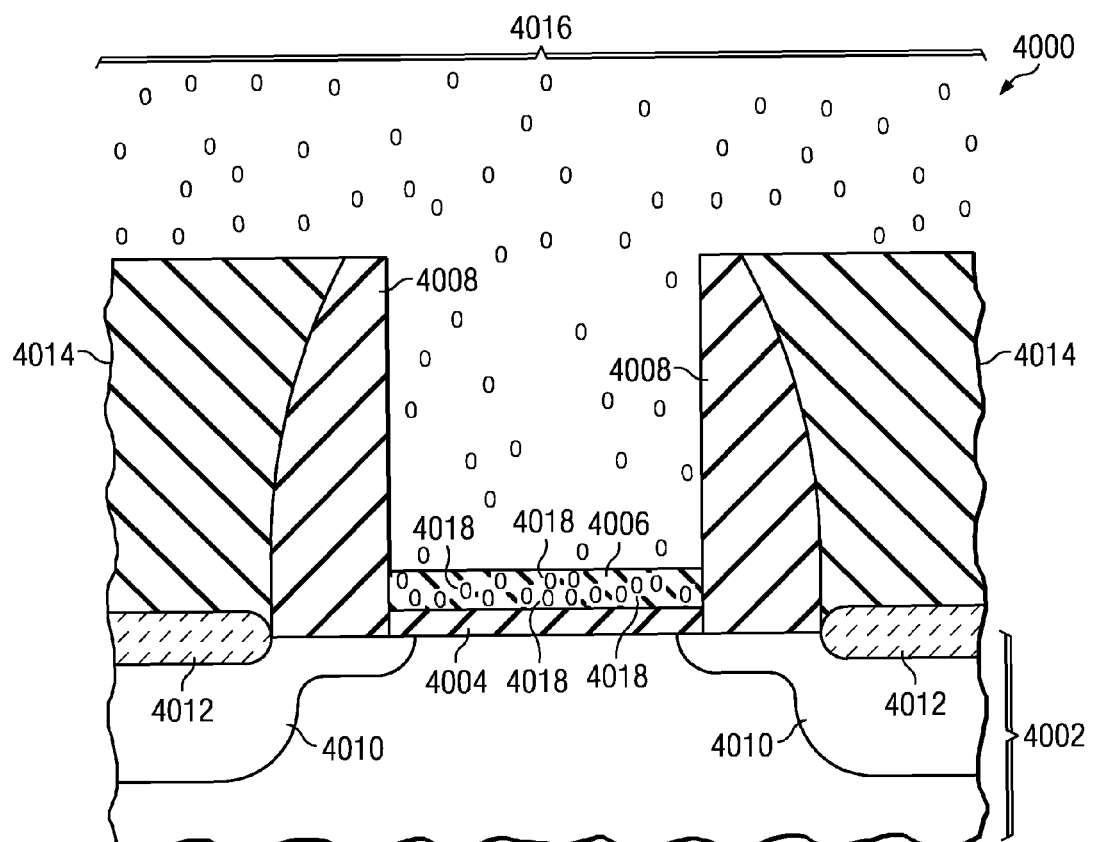
FIG. 4A and FIG. 4B are cross-sections of an integrated circuit containing a PMOS transistor formed according to the instant invention, depicted during a third embodiment of a low temperature oxidation process to diffuse oxygen atoms into a PMOS gate work function metal layer.
Figure 4B:
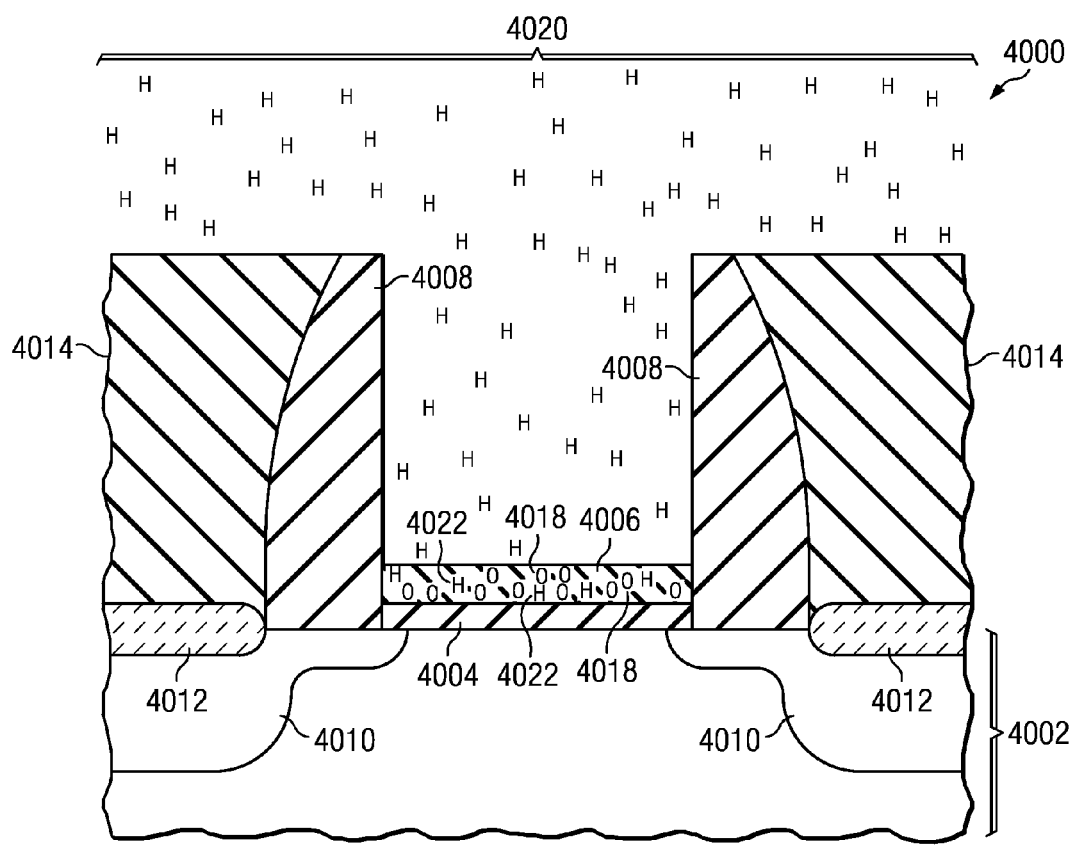

FIG. 4A and FIG. 4B are cross-sections of an integrated circuit containing a PMOS transistor formed according to the instant invention, depicted during a third embodiment of a low temperature oxidation process to diffuse oxygen atoms into a PMOS gate work function metal layer. Referring to FIG. 4A, the integrated circuit 4000 is formed on a substrate 4002 as described in reference to FIG. 1A. A PMOS gate structure including a PMOS gate dielectric layer 4004, a PMOS gate work function metal layer 4006 and PMOS gate sidewall spacers 4008 is formed on a top surface of the substrate 4002 as described in reference to FIG. 1A through FIG. 1D. PSD regions 4010 are formed in the substrate 4002 adjacent to the PMOS gate dielectric layer 4004, and PSD silicide layers 4012 are formed on a top surface of the PSD regions 4010, as described in reference to FIG. 1B. An oxide fill layer 4014 is formed on a top surface of the integrated circuit 4000 in contact with the PMOS gate sidewall spacers 4008, as described in reference to FIG. 1C. A dummy gate layer is formed over the PMOS gate work function metal layer 4006 and subsequently removed, as described in reference to FIG. 1A through FIG. 1D.

The third embodiment of the low temperature oxidation process includes exposure to an oxygen plasma and exposure to a hydrogen plasma. In a first version of the third embodiment, the integrated circuit 4000 is exposed to the oxygen plasma and subsequently exposed to the hydrogen plasma. In the first version of the third embodiment, the oxygen plasma may be formed at a pressure between 50 and 150 millitorr. A flow rate of oxygen gas into the oxygen plasma may be between 5 and 50 sccm in a plasma chamber which can accommodate a 300 mm wafer. The oxygen plasma may also contain an inert gas such as argon. In another version of the third embodiment, a flow rate of argon into the oxygen plasma may be between 500 and 1500 sccm in the 300 mm wafer plasma chamber. Microwave power provided to the oxygen plasma may be between 500 and 1500 watts in the 300 mm wafer plasma chamber. A temperature of the integrated circuit 4000 during exposure to the oxygen plasma may be between 25 C and 400 C. The oxygen plasma provides oxygen radicals and/or ions 4016 to a top surface of the PMOS gate work function metal layer 4006.

During exposure to the oxygen plasma, oxygen atoms 4018 diffuse into the PMOS gate work function metal layer 4006. In one version of the third embodiment, the oxygen atoms 4018 in the PMOS gate work function metal layer 4006 may have a distribution of at least $1\times10^{15}$ atoms/cm$^2$ within 1 nanometer of the top surfaces of the PMOS gate dielectric layer 4004. In another embodiment, the oxygen atoms 4018 in the PMOS gate work function metal layer 4006 may have an average concentration between $1\times10^{18}$ atoms/cm$^3$ and $1\times10^{21}$ atoms/cm$^3$. The oxygen atoms 4018 desirably increase the effective work function of the PMOS gate work function metal layer 4006 to above 4.85 eV. In the first version of the third embodiment, the integrated circuit 4000 may be exposed to the oxygen plasma between 5 and 20 seconds, depending on an oxygen diffusion rate into the PMOS gate work function metal layer 4006.

Referring to FIG. 4B, in the first version of the third embodiment, the hydrogen plasma may be formed at a pressure between 250 and 500 millitorr. A flow rate of hydrogen gas into the hydrogen plasma may be between 5 and 20 sccm in a plasma chamber which can accommodate a 300 mm wafer. The hydrogen plasma may also contain an inert gas such as argon. In another version of the third embodiment, a flow rate of argon into the hydrogen plasma may be between 500 and 1500 sccm in the 300 mm wafer plasma chamber. Microwave power provided to the hydrogen plasma may be between 500 and 1500 watts in the 300 mm wafer plasma chamber. A temperature of the integrated circuit 4000 during exposure to the hydrogen plasma may be between 25 C and 500 C. The hydrogen plasma provides hydrogen radicals (hydrogen atoms) and/or hydrogen ions 4020, and possibly deuterium atoms and/or deuterium ions, not shown, to a top surface of the PMOS gate work function metal layer 4006.

During exposure to the hydrogen plasma, hydrogen atoms 4022 and possibly deuterium atoms diffuse into the PMOS gate work function metal layer 4006. In some versions of the third embodiment, the hydrogen atoms 4022 and deuterium atoms in the PMOS gate work function metal layer 4006 may have a distribution of at least $1 \times 10^{15}$ atoms/cm$^2$ within 1 nanometer of the top surfaces of the PMOS gate dielectric layer 4004. Hydrogen atoms 4022 and deuterium atoms desirably reduce interface states at a boundary between the PMOS gate work function metal layer 4006 and the PMOS gate dielectric layer 4004. The integrated circuit 4000 may be exposed to the hydrogen plasma between 10 and 40 seconds, depending on a hydrogen diffusion rate into the PMOS gate work function metal layer 4006. It will be recognized by those familiar with MOS transistor design and fabrication that benefits of incorporation of hydrogen into the PMOS gate work function metal layer 4006 may be increased by substituting deuterium for hydrogen. Accordingly, in some executions of the first version of the third embodiment, the hydrogen plasma may include deuterium at a ratio to hydrogen above one percent.

In a second version of the third embodiment, the integrated circuit is exposed to the hydrogen plasma and subsequently exposed to the oxygen plasma. In the second version of the third embodiment, the hydrogen plasma may be formed at a pressure between 50 and 250 millitorr. A flow rate of hydrogen gas into the hydrogen plasma may be between 5 and 20 sccm in a plasma chamber which can accommodate a 300 mm wafer. The hydrogen plasma may also contain an inert gas such as argon. In another version of the third embodiment, a flow rate of argon into the hydrogen plasma may be between 500 and 1500 sccm in the 300 mm wafer plasma chamber. Microwave power provided to the hydrogen plasma may be between 500 and 1500 watts in the 300 mm wafer plasma chamber. A temperature of the integrated circuit 4000 during exposure to the hydrogen plasma may be between 25 C and 500 C. In the second version of the third embodiment, the oxygen plasma may be formed as described in reference to the first version of the third embodiment. Distributions of oxygen atoms 4018 and hydrogen atoms 4022 and deuterium atoms in the PMOS gate work function metal layer 4006 resulting from the second version of the third embodiment are as described in reference to the first version of the third embodiment.

Figure 5:
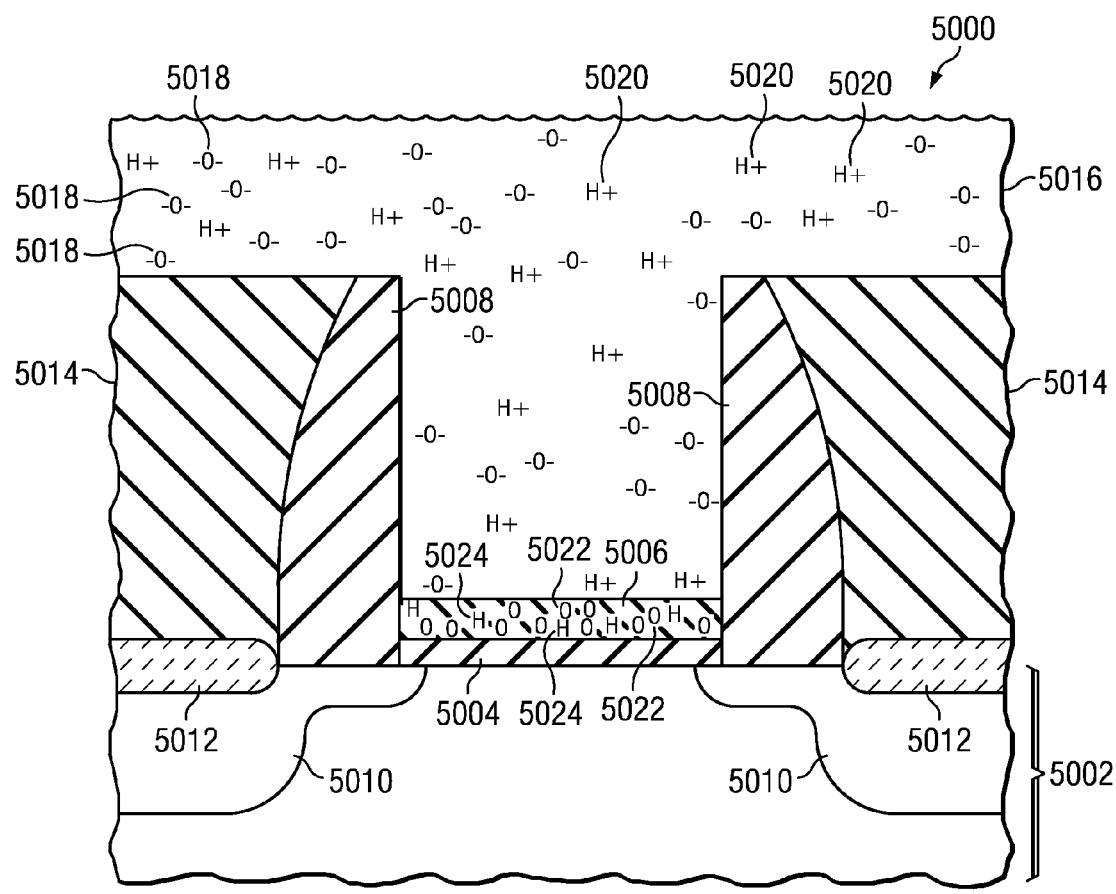
FIG. 5 is a cross-section of an integrated circuit containing a PMOS transistor formed according to the instant invention, depicted during a fourth embodiment of a low temperature oxidation process to diffuse oxygen atoms into a PMOS gate work function metal layer.

FIG. 5 is a cross-section of an integrated circuit containing a PMOS transistor formed according to the instant invention, depicted during a fourth embodiment of a low temperature oxidation process to diffuse oxygen atoms into a PMOS gate work function metal layer. The integrated circuit 5000 is formed on a substrate 5002 as described in reference to FIG. 1A. A PMOS gate structure including a PMOS gate dielectric layer 5004, a PMOS gate work function metal layer 5006 and PMOS gate sidewall spacers 5008 is formed on a top surface of the substrate 5002 as described in reference to FIG. 1A through FIG. 1D. PSD regions 5010 are formed in the substrate 5002 adjacent to the PMOS gate dielectric layer 5004, and PSD silicide layers 5012 are formed on a top surface of the PSD regions 5010, as described in reference to FIG. 1B. An oxide fill layer 5014 is formed on a top surface of the integrated circuit 5000 in contact with the PMOS gate sidewall spacers 5008, as described in reference to FIG. 1C. A dummy gate layer is formed over the PMOS gate work function metal layer 5006 and subsequently removed, as described in reference to FIG. 1A through FIG. 1D.

The fourth embodiment of the low temperature oxidation process includes exposure to an electrolyte solution 5016 containing ionized oxygen radicals 5018 and hydrogen ions 5020 and possibly deuterium ions, not shown. The electrolyte solution 5016 may include alcohols such as methanol or ethanol, aldehydes such as formaldehyde or acetaldehyde, amides such as acetamide or formamide, carboxylic acids such as formic acid or acetic acid, ethers such as dimethyl ether or diethyl ether, peroxides such as hydrogen peroxide or an organic hydroperoxide, ketones such as acetone or methyl ethyl ketone, alkaline chemicals such as ammonium hydroxide or tetra-methyl ammonium hydroxide.

In a first version of the fourth embodiment, a negative electrical potential is applied to the electrolyte solution 5016 with respect to the substrate 5002, causing ionized oxygen radicals 5018 in the electrolyte solution 5016 to drift to the PMOS gate work function metal layer 5006. Oxygen atoms 5022 diffuse into the PMOS gate work function metal layer 5006. A temperature of the integrated circuit may be up to 100 C while the negative electrical potential is applied to the electrolyte solution 5016. In the first version of the fourth embodiment, the oxygen atoms 5022 in the PMOS gate work function metal layer 5006 may have a distribution of at least $1 \times 10^{15}$ atoms/cm$^2$ within 1 nanometer of the top surfaces of the PMOS gate dielectric layer 5004. Alternatively, the oxygen atoms 5022 in the PMOS gate work function metal layer 5006 may have an average concentration between $1 \times 10^{18}$ atoms/cm$^3$ and $1 \times 10^{21}$ atoms/cm$^3$. The oxygen atoms 5022 desirably increase the effective work function of the PMOS gate work function metal layer 5006 to above 4.85 eV. In the first version of the fourth embodiment, the negative electrical potential may be applied to the electrolyte solution 5016 until between $1 \times 10^{-6}$ and $1 \times 10^{-2}$ coulombs are passed per square centimeter of area of the PMOS gate dielectric layer 5004.

In a second version of the fourth embodiment, a temperature of the integrated circuit 5000 is maintained between 25 C and 150 C while being exposed to the electrolyte solution 5016. Ionized oxygen radicals 5018 and hydrogen ions 5020 and deuterium ions, not shown, in the electrolyte solution 5016 diffuse to the PMOS gate work function metal layer 5006. Oxygen atoms 5022 and hydrogen atoms 5024 and deuterium atoms diffuse into the PMOS gate work function metal layer 5006. In the second version of the fourth embodiment, the oxygen atoms 5022 in the PMOS gate work function metal layer 5006 may have a distribution of at least $1 \times 10^{15}$ atoms/cm$^2$ within 1 nanometer of the top surfaces of the PMOS gate dielectric layer 5004. Alternatively, the oxygen atoms 5022 in the PMOS gate work function metal layer 5006 may have an average concentration between $1 \times 10^{18}$ atoms/cm$^3$ and $1 \times 10^{21}$ atoms/cm$^3$. The oxygen atoms 5022 desirably increase the effective work function of the PMOS gate work function metal layer 5006 to above 4.85 eV. The hydrogen atoms 5024 and deuterium atoms in the PMOS gate work function metal layer 5006 may have a distribution of at least $1 \times 10^{15}$ atoms/cm$^2$ within 1 nanometer of the top surfaces of the PMOS gate dielectric layer 5004.

It will be recognized by those familiar with MOS transistor design and fabrication that benefits of incorporation of hydrogen into the PMOS gate work function metal layer 5006 may be increased by substituting deuterium for hydrogen. Accordingly, in some versions of the fourth embodiment, the electrolyte includes deuterium ions at a ratio to hydrogen ions above one percent.

In each of the embodiments described herein, the integrated circuits may contain n-channel metal oxide semiconductor (NMOS) transistors, and possibly other components such as diodes, resistors and capacitors. In each embodiment, oxygen incorporation occurs in PMOS transistors as described, and not in NMOS transistors, if present.

What is claimed is:

1. An integrated circuit comprising a PMOS transistor, said PMOS transistor further including:
   a substrate;
   a PMOS gate dielectric layer formed on a top surface of said substrate;
   a PMOS gate work function metal layer formed on a top surface of said PMOS gate dielectric layer, such that:
      said PMOS gate work function metal layer includes oxygen atoms such that said oxygen atoms have a distribution of at least $1 \times 10^{15}$ atoms/cm$^2$ within 1 nanometer of said top surface of said PMOS gate dielectric layer; and
      said PMOS gate work function metal layer includes oxygen such that an effective work function of said PMOS gate work function metal layer is above 4.85 eV; and
   a PMOS metal fill gate formed over and in direct electrical connection with said PMOS gate work function metal layer.

2. The integrated circuit of claim 1, in which said PMOS gate work function metal layer is between 1 and 10 nanometers thick.

3. The integrated circuit of claim 1, in which said PMOS gate work function metal layer includes a metal selected from the group consisting of:
   TiN,
   TaN, and
   TaC.

4. The integrated circuit of claim 1, wherein said PMOS gate work function metal layer includes hydrogen atoms, deuterium atoms or a combination thereof, such that said hydrogen and deuterium atoms have a distribution of at least $1 \times 10^{15}$ atoms/cm$^2$ within 1 nanometer of said top surface of said PMOS gate dielectric layer.

5. The integrated circuit of claim 1, in which a composition of said PMOS gate dielectric layer is selected from the group consisting of:
   SiO$_2$,
   SiON,
   Al$_2$O$_3$,
   AlON,
   HfO,
   HfSiO,
   HfSiON,
   ZrO,
   ZrSiO,
   ZrSiON,
   nitridated SiO$_2$,
   nitridated Al$_2$O$_3$,
   nitridated HfO,
   nitridated HfSiO,
   nitridated ZrO,
   nitridated ZrSiO, and
   any combination thereof.

6. An integrated circuit comprising a PMOS transistor, said PMOS transistor further including:
   a substrate;
   a PMOS gate dielectric layer formed on a top surface of said substrate;
   a PMOS gate work function metal layer formed on a top surface of said PMOS gate dielectric layer, such that:
      said PMOS gate work function metal layer includes oxygen atoms such that said oxygen atoms have an average concentration between $1 \times 10^{18}$ atoms/cm$^3$ and $1 \times 10^{21}$ atoms/cm$^3$; and
      said PMOS gate work function metal layer includes oxygen such that an effective work function of said PMOS gate work function metal layer is above 4.85 eV; and
   a PMOS metal fill gate formed over and in direct electrical connection with said PMOS gate work function metal layer.

7. The integrated circuit of claim 6, in which said PMOS gate work function metal layer is between 1 and 10 nanometers thick.

8. The integrated circuit of claim 6, in which said PMOS gate work function metal layer includes a metal selected from the group consisting of:
   TiN,
   TaN, and
   TaC.

9. The integrated circuit of claim 6, wherein said PMOS gate work function metal layer includes hydrogen atoms, deuterium atoms or a combination thereof, such that said hydrogen and deuterium atoms have a distribution of at least $1 \times 10^{15}$ atoms/cm$^2$ within 1 nanometer of said top surface of said PMOS gate dielectric layer.

10. The integrated circuit of claim 6, in which a composition of said PMOS gate dielectric layer is selected from the group consisting of:
    SiO$_2$,
    SiON,
    Al$_2$O$_3$,
    AlON,
    HfO,
    HfSiO,
    HfSiON,
    ZrO,
    ZrSiO,
    ZrSiON,
    nitridated SiO$_2$,
    nitridated Al$_2$O$_3$,
    nitridated HfO,
    nitridated HfSiO,
    nitridated ZrO,
    nitridated ZrSiO, and
    any combination thereof.

* * * * *